United States Patent
Johnson

(10) Patent No.: US 9,432,021 B2
(45) Date of Patent: Aug. 30, 2016

(54) RECONFIGURABLE MAGNETOELECTRONIC PROCESSING SYSTEM

(71) Applicant: Mark B. Johnson, Potomac, MD (US)

(72) Inventor: Mark B. Johnson, Potomac, MD (US)

( * ) Notice: Subject to any disclaimer, the term of this patent is extended or adjusted under 35 U.S.C. 154(b) by 0 days.

(21) Appl. No.: 14/703,006

(22) Filed: May 4, 2015

(65) Prior Publication Data
US 2016/0020769 A1 Jan. 21, 2016

Related U.S. Application Data

(63) Continuation of application No. 14/133,055, filed on Dec. 18, 2013, now Pat. No. 9,024,656.

(60) Provisional application No. 61/739,757, filed on Dec. 20, 2012.

(51) Int. Cl.
*H03K 3/59* (2006.01)
*H03K 19/0175* (2006.01)
*H03K 19/177* (2006.01)

(52) U.S. Cl.
CPC .. *H03K 19/017581* (2013.01); *H03K 19/1776* (2013.01)

(58) Field of Classification Search
CPC ..... H01L 27/22; H01L 27/222; G11C 11/16; G11C 11/161; G11C 11/18
USPC ................................. 326/37–41, 47
See application file for complete search history.

(56) References Cited

U.S. PATENT DOCUMENTS

| | | | | |
|---|---|---|---|---|
| 5,629,549 A | * | 5/1997 | Johnson | G11C 11/16 257/421 |
| 6,140,838 A | * | 10/2000 | Johnson | G11C 11/16 326/136 |
| 7,379,321 B2 | * | 5/2008 | Ravelosona | G11B 5/193 257/30 |
| 7,397,285 B2 | * | 7/2008 | Agan | H03K 19/20 326/104 |
| 2014/0167814 A1 | * | 6/2014 | Chang | H03K 19/16 326/38 |
| 2014/0176184 A1 | * | 6/2014 | Johnson | H03K 19/017581 326/37 |

OTHER PUBLICATIONS

Behin-Aein, B. et al., "Proposal for an All-Spin Logic Device with Built-in Memory," Nature Nanotech 5, 266 (2010).
Johnson, Mark et al., "Magnetoelectronic Latching Boolean Gate," Solid State Electronics 44, 1099 (2000), 6 pages.
Joo, S. et al., "Magnetic field controlled reconfigurable semiconductor logic," published online in Nature, approximately Jan. 30, 2013, 15 pages.
Ney, A. et al., "Programmable Computing with a Single Magnetoresistive Element," Nature 425, 485 (2003), 3 pages.
Salahuddin, S., "A new spin on spintronics," published online in Nature, Feb. 7, 2013, 2 pages.
Xu, P. et al., "An All-Metal Logic Gate Based on Current-Driven Domain Wall Motion," Nature Nanotech 3, 97 (2008), 4 pages.

* cited by examiner

*Primary Examiner* — Jason M Crawford
(74) *Attorney, Agent, or Firm* — Law Office of J. Nicholas Gross P.C.

(57) ABSTRACT

Magnetoelectronic (ME) logic circuits and methods of operating the same are disclosed for use in energy constrained applications in which logic operations are carried out using a minimal number of physical operations. Microsystems of different circuits made from different types of ME devices can be constructed and employed in applications such as sensors, smart dust, etc. including in clockless applications.

23 Claims, 5 Drawing Sheets

RECONFIGURABLE MAGNETOELECTRONIC PROCESSING SYSTEM

RELATED APPLICATION DATA

The present application is a continuation of and claims priority to application Ser. No. 14/133,055 filed Dec. 18, 2013—now U.S. Pat. No. 9,024,656—which in turn claims the benefit under 35 U.S.C. §119(e) of the priority date of Provisional Application Ser. No. 61/739,757 filed Dec. 20, 2012, all of which are hereby incorporated by reference.

STATEMENT AS TO GOVERNMENT RIGHTS

This application was filed during a time when the inventor was employed by the Naval Research Laboratory as part of Task Area MA02-01-46, Work Unit T042-97, and was developed as a result of efforts associated with NRF grants funded by MEST (2010-0000506, 2011-0012386 and 2012-0005631), the industrial strategic technology development program funded by MKE (KI002182), the Dream project, MEST (2012K001280), GRL and the Office of Naval Research. To the extent they are not otherwise alienated, disclaimed or waived, the government may have certain limited rights to use, practice or otherwise exploit some or all portions of the inventions herein.

FIELD OF THE INVENTION

The invention describes methods and circuit architectures for using novel magnetoelectronic devices to perform logic operations. The new architecture results in circuits that can perform information processing with very low power consumption.

BACKGROUND

The following documents are incorporated by reference herein:
[1] Mark Johnson, U.S. Pat. No. 5,629,549 (May 13, 1997).
[2] Mark Johnson, B. R. Bennett, P. R. Hammar and M. M. Miller, "Magnetoelectronic Latching Boolean Gate," Solid State Electronics 44, 1099 (2000).
[3] A. Ney et al., Programmable Computing with a Single Magnetoresistive Element," Nature 425, 485 (2003).
[4] P. Xu et al., "An All-Metal Logic Gate Based on Current-Driven Domain Wall Motion," Nature Nanotech 3, 97 (2008).
[5] B. Behin-Aein et al., "Proposal for an All-Spin Logic Device with Built-in Memory," Nature Nanotech 5, 266 (2010).
[6] J. Hong, M. Johnson et al., "Magnetic field controlled reconfigurable semiconductor logic," published online in Nature, approximately Jan. 30 2013.

The existing technology for information processing is based on digital semiconductor electronics, dominated by Complementary Metal Oxide Semiconductor (CMOS) technology. The basic device is a Field Effect Transistor (CMOS FET), a planar, three terminal device comprising a source, drain, a channel connecting source and drain, and a gate. A gate voltage applied to the gate modulates the source-drain conductance, equivalently the conductance of the channel. Logical gates that perform basic Boolean operations on binary inputs of "0" or "1" are formed using arrangements of 4 to 8 FETs. The basic Boolean operations include AND, OR, NAND, NOR, XOR, and XNOR. More complex logic functions are built up using arrangements of the basic gates. High speed memory cells, Static Random Access Memory (SRAM), also are formed using arrangements of 4 to 8 FETs. Another kind of high speed memory, called a "flip-flop" or a "latch" memory, can be formed from a different arrangement of FETs. A combination of FETs can be arranged to form an on/off or "pass" switch. One example, a tri-state buffer, can pass a "0" or a "1" or it can disconnect its output from the output line. A tri-state buffer (also called an "on (pass)/off" switch) allows multiple outputs to connect to a single wire, permitting only one of them to drive a binary "0" or "1" onto the line.

A CMOS FET is an active device. It is connected to a supply voltage (typically called $V_{DD}$) and a ground. The FET dissipates power during operation. When idle, the FET dissipates quiescent power in proportion to its characteristic leakage current. Any CMOS logic operation begins by supplying power to the circuit and all CMOS FETs dissipate power at any time that power is supplied. When power to the circuit is removed, all results of the logic operations are is erased unless a separate operation has been used to write the results to a separate memory array, either on- or off-chip. These kinds of logic circuits and operations can be called "volatile" logic, and volatile logic dissipates quiescent power.

FIG. 4 is a block diagram of a prior art microprocessor, adapted from the article "How Microprocessors Work," by Marshall Brain [http://computer.howstuffworks.com/microprocessor2.htm/]. This represents the architecture of existing logic circuits (prior art), based on FETs. The combinations of devices introduced above form the elements (boxes) in the microprocessor diagram. The detailed operation of logic circuits is not necessary for an understanding of the invention. An introduction and general discussion of a microprocessor may be beneficial and is provided in the following remarks.

The microprocessor represented in FIG. 4 may be a simple unit for simple operations. It may also represent a more complicated unit such as the central processing unit (CPU) of a computer or computing system. The Clock is typically separate from the microprocessor, and there is a separate memory area (on- or off-chip) connected to the processor by one or more bus lines. The ALU is the Arithmetic Logic Unit and it performs binary logic operations. The Instruction Decoder accepts commands from a program (for example, it may retrieve a program from memory), translates the command to binary instructions and operations that can be performed at a low, granular level (sometimes called "machine language"), and controls the individual components of the microprocessor. In the simplest case, the ALU performs one of the basic Boolean operations AND, OR, NAND, NOR, NOT, XOR, XNOR, and operates on single bits. At a slightly higher level, the ALU might be a half adder. A slightly higher level would be a full adder operating on 8 bits. At a rather high level, the ALU might perform addition, subtraction, multiplication and division of n-bit numbers. For a simple example, it may be helpful to think of a basic Boolean operation on two bits, stored in Registers A and B ("flip-flop" or "latch" memory), with the output stored in Register C. In FIG. 4, black lines represent lines that pass data (also called bus lines).

The Instruction decoder has a control line to each element in the microprocessor (gray lines in FIG. 4). These control lines send instructions. For example, the Instruction decoder may send the following instructions:

Tell the A register to latch (store) the value currently on the data bus.

Tell the B register to latch the value currently on the data bus.

Tell the C register to latch the value currently output by the ALU.

Tell the program counter register to latch the value currently on the data bus.

Tell the address register to latch the value currently on the data bus.

Tell the instruction register to latch the value currently on the data bus.

Tell the program counter to increment.

Tell the program counter to reset to zero.

Activate an On (pass)/Off switch, allowing data to pass through (default is Off, an open circuit).

Tell the ALU what operation to perform.

Tell the test register to latch the test bit from the ALU (e.g. for comparison at later step).

Activate the Read line.

Activate the Write line.

The Instruction decoder can receive bits of data from the Test Register and the Instruction Register. It is driven by the Clock and can be reset by external command.

Any instruction is implemented as a series of bit patterns, and a set of instructions is a program. The Instruction decoder may receive a program by reading it from memory, or it may receive a program from external input. The Instruction decoder has a list of basic instructions stored in "read only memory" (ROM), and it translates lines of program memory to lines of basic instructions. Simple instructions are coded as words in "Assembly" language. Some examples of simple instructions are given below. In the following, "address" may refer to an external address, such as an address on a different chip or a different sector (e.g. memory). "Address" may also refer to one of the elements in the microprocessor, or to a specific line in the program.

LOADA mem# Load register A with the binary value in memory address
"mem#"
The sequence of low-level instructions would be:
send "mem#" to address register (from Instruction Register)
activate On/Off switch to open line to Address bus line
activate read line (data in address register "mem#" is sent to Data bus)
activate On/Off switch to open "Data in" line to Data bus
activate On/Off switch to open Register A
data is sent to Register A and latched (stored)
LOADB mem# Load register B with the binary value in address "mem#"
CONB const Load constant value "const" into register B [similar for register A]
SAVEA mem# Save the binary value in register A to address "mem#" [similar for registers B, C]
ADD Add the values in registers A and B and store the result in register C
SUB Subtract the values in registers A and B and store the result in register C
MUL Multiply the values in registers A and B and store the result in register C
DIV Divide the values in registers A and B and store the result in register C
COM Compare the values in registers A and B and store the result in register C
JUMP addr# Jump to address "addr#"
JEQ addr# If equal, jump to address "addr#"
JNEQ addr# If not equal, jump to address "addr#"
JG addr# If greater than, jump to address "addr#"
JGE addr# If greater than or equal to, jump to address "addr#"
JL addr# If less than, jump to address "addr#"
JLE addr# If less than or equal to, jump to address "addr#"
STOP Stop execution As another example of a simple operation, the ADD instruction would require the following set of signals from the Instruction decoder:
First clock cycle: (load the instruction)
Activate the On/Off switch for the program counter
Activate the Read line
(the current program line address is sent to memory)
Activate the On/Off switch for the data-in line
Read the instruction into the Instruction Register
Second clock cycle: (decode the ADD instruction)
set the ALU operation to addition
send the output of the ALU to Register C and store (latch)
Third clock cycle: (increment program counter)
send increment command from Instruction Decoder to Program counter According to the prior art represented by FIG. 4, all of the digital electronic devices and structures represented with blocks are active devices. They draw power from a power supply at a specified voltage (called $V_{DD}$ for CMOS, as mentioned above). For the microprocessor to operate, a power supply is switched ON and all the elements inside the heavily dotted lines in FIG. 4 draw power. They continue to draw power until the power supply is switched OFF, at which time the results of all logic processes are erased unless they have been stored to a separate nonvolatile storage chip or device. As noted above, the Clock is continuously powered and may reside on the processor chip or may be a separate, stand-alone unit.

SUMMARY OF THE INVENTION

An object of the present invention, therefore, is to overcome the aforementioned limitations of the prior art. It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions.

A first aspect of the invention concerns a reconfigurable processing system. This innovative device preferably includes a first memory circuit that includes a first plurality of magnetic field controlled devices of a first type adapted to store program data and operations data; and a second processing circuit that includes one or more second magnetic field controlled device(s) of a second type adapted to perform a first set of operations during an operational mode in accordance with a first program stored in said first memory circuit. In this system all of the first plurality of magnetic field controlled devices and the one or more second magnetic field controlled device(s) are passive devices and consume substantially zero quiescent power in a non-operational mode. Rather, these devices only consume power during an operational mode, which is activated in response to a set of operational pulses received from an external pulse circuit and/or onboard pulses from one or more of said first plurality of magnetic field controlled devices and/or one or more second magnetic field controlled devices. The system is adapted further so that it can be reconfigured dynamically during the operational mode to perform a second set of operations on data as may be required for any particular applications task.

A related aspect of the invention concerns a remote independent microsystem (RIM) based on the aforementioned processor, which RIM device is adapted to process data from sensors, external stimuli, etc., and render an output that can be read or used to trigger a payload of some kind. The RIM device is particularly suited in applications where small size, expendability and low power are required.

Another aspect of the invention concerns methods of operating the aforementioned processor and RIM, which only use a set of pulses for each operation. This ensures low power and wider applicability to a variety of field applications. In some applications it is possible to reduce the footprint of the is processor so as to utilize only a single gate for every operation required as part of a task.

Another aspect of the invention concerns methods of configuring the reconfigurable processor and RIM, including by optimizing a set of operations, a set of gates, etc., based on consideration an overall operational count required of the system in any particular application.

DETAILED DESCRIPTION

Figure 1:
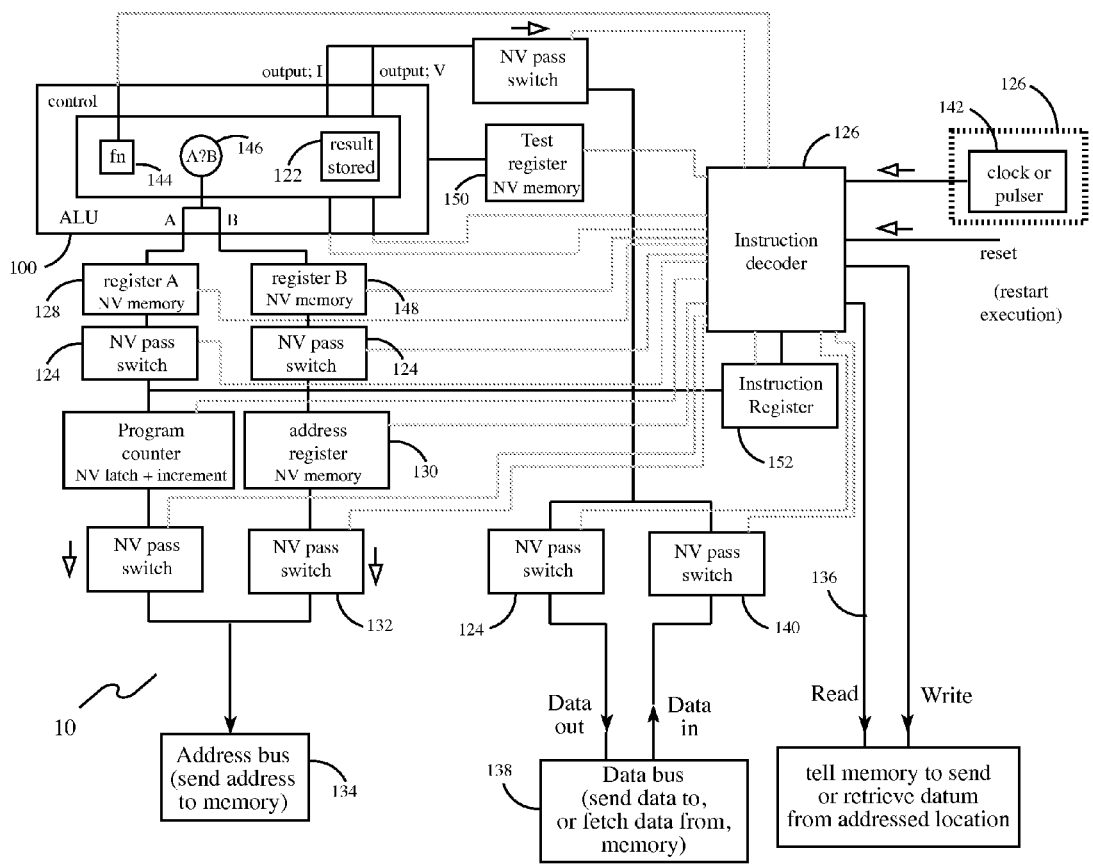
FIG. 1 is a schematic diagram of a preferred embodiment of a reconfigurable non-volatile magnetoelectronic microprocessor implemented in accordance with the present teachings.

In the past twenty years, research in the field of magnetism has developed new kinds of digital electronic devices that utilize electron spin and/or incorporate a ferromagnetic thin film component. The subfield of research is called "Spintronics" or "Magnetoelectronics," and devices that have been developed include the magnetic tunnel junction (MTJ), spin valve, lateral spin valve, spin transistor, and hybrid Hall device. A novel spintronic device is reported in the publication "Magnetic field controlled reconfigurable semiconductor logic," by J. Hong, M. Johnson et al., referenced above. This article describes a combination of an avalanche diode and one or more thin film ferromagnetic (F) elements. These F elements generate fringe magnetic fields that modulate the characteristics of an avalanche diode channel.

Magnetoelectronic devices are not active devices, but instead they are passive devices. For digital electronics applications, binary "0" or "1" is typically associated with a high or low resistance state, which in turn is related to the magnetization orientation of one or more F elements. Spintronic devices typically are nonvolatile; the device state is stored as one of two bistable magnetization orientations (states) of an F element. The dominant application of these devices is a memory cell in a nonvolatile random access memory (Magnetic RAM, MRAM; or Nonvolatile RAM, NVRAM).

The device state is written by using a current pulse. The current pulse may be applied to a wire that is inductively coupled to the F element, in which case the magnetic field from the write current is set to be larger than the coercivity of F and the polarity of the write current determines the orientation of F (and therefore the device state). Alternatively, the write current may be driven through a separate ferromagnetic film and thereby provide a spin polarized current to F. The spin polarized current can set the magnetization orientation of F by a process called spin transfer torque (STT).

For most spintronic devices, the write process utilizes a current, and readout is provided as a voltage. There have been several suggestions for using spintronic devices to perform logic operations (refer to references above). However, these proposals have not proceeded beyond simple demonstrations of rudimentary operations and have not been developed for commercial use. The main reason for the severe limits to implementation for logic operation is that device input requires a current, but none of the prior spintronic devices can offer output with current gain. It is therefore impossible for one device to drive a following device.

Among spintronic devices a new magnetic avalanche diode (also called magnetic field controlled avalanche diode, MFCAD) is unique because the output is an electric current, and the current gain is greater than one. With this characteristic, the magnetic avalanche diode is capable of fanout, similar to a generic CMOS gate. In other words, it is capable of being linked to a chain of devices, with the output of one device providing the input of another device (or devices). In this way, complex operations can be performed. For the purpose of this disclosure the magnetic avalanche diode is used as the preferred basic element. This is analogous with describing digital semiconducting microprocessor architecture with the use of the CMOS FET as the basic element. It will be understood by those skilled in the art that other spintronic devices subsequently developed or altered in a manner that achieves fanout can be used in accordance with the present teachings.

Figure 2:
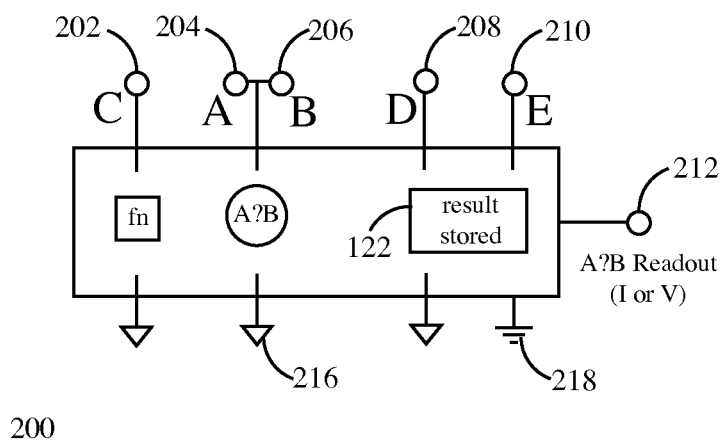
FIG. 2 depicts a preferred embodiment of a generic magnetoelectronic logic cell used in the present invention, which includes a magnetic avalanche diode as the preferred logic element.

FIG. 2 represents a generic description of a magnetic avalanche diode logic device cell 200. This cell includes a nonvolatile memory element (for example, an MTJ) that provides voltage readout as an alternative to current readout. The operation of the cell involves 4 steps (in the first 2 steps, the input pulse is configured as a current pulse but other circuit considerations may allow the pulse to be defined as a voltage pulse):

1) Sending a pulse to terminal C 202: this sets the magnetization of the "Control" F element and thereby controls the function of the device, for example to perform one of several possible Boolean operations. Examples are AND, OR, NAND, NOR etc. The abbreviation "A?B" represents the chosen operation.

2) Sending input pulses to input terminal A 204 and input terminal B 206: these pulses set the magnetization states of the two F elements that provide input magnetic fields A and B. The localized A and B fields determine the output of the gate.

3) Sending a pulse to bias terminal D 208: this applies a voltage pulse across the diode channel and results in a current that is either large or small, depending on the resistance of the channel which, in turn, depends on input fields A and B. This "readout" of the results can be done at any time after step (2) and provides a current output. This current also is sent as input to a magnetic storage element, such as an MTJ or a magnetic field controlled avalanche diode (MFCAD), in the same cell. Pulses to terminals C, A, B and D may share a common ground 216. The output current may be sensed by an ammeter between terminal 208 and ground 216. Alternatively, the output current may be made available at a separate terminal 212.

4) Sending a pulse to bias terminal E 210: this applies a voltage pulse to the nonvolatile magnetic storage element and the output indicates the stored value. Depending on the type of magnetoelectronic device used, the output could be a high or low voltage (using an MTJ) or a high or low current (using an MFCAD). A voltage readout may be convenient for transmission to an output port, or as a voltage bias to another device.

As mentioned above, the preferred magnetic avalanche diode element 200 is characterized as being passive and nonvolatile. Unlike a conventional semiconductor device, device 200 is not connected to a constant power source such as $V_{DD}$. Device function is achieved with the application of individual pulses. The device state, which can be associated with binary "0" or "1", is retained as a nonvolatile state when the circuit containing the device is disconnected from any power supply. When used for logic operations, the circuits can be described as nonvolatile logic microprocessors.

In the description below, it is helpful to consider some characteristics of the magnetic avalanche diode that are discussed in Ref. [6]. Although the is prototype devices had dimensions of approximately 10 microns, the authors of Ref. [6] make projections for the characteristics of a device with dimensions of roughly 100 nm. The device has two output levels: the high current state is 200 µA and the low current state is 40 µA. The input write current amplitude required for STT switching is 200 µA (for a pulse duration of a few nsec, lower amplitude for longer duration). These projections are based on spin lifetimes observed in the prototypes. Avalanche diodes are the subject of active research and it is expected that the current of the low state will be diminished in subsequent generations by at least a factor of ten. The resulting low state current is expected to be about 4 µA, a value sufficiently low that the magnetic avalanche diode could operate effectively as a "pass" switch for current.

FIG. 1 is a block diagram of a preferred embodiment of a reconfigurable microprocessor system 10 using nonvolatile logic or, more specifically, nonvolatile reconfigurable logic, and which is preferably situated on a single semiconductor chip. To follow the same level of simplicity as used in FIG. 4, ALU 100 is preferably a single magnetoelectronic cell that is capable of performing any of several basic Boolean operations. Such a cell 100 (200) was introduced in FIG. 2. The result is stored in a nonvolatile way and can be read out at any later time, either as a current or a voltage. This is represented by the box "result stored" (122) in FIG. 1, and this function is somewhat similar to that of Register C in FIG. 4. Whereas the prior art microprocessor of FIG. 4 used volatile flip-flop memory as Registers, the nonvolatile microprocessor of FIG. 1 uses magnetoelectronic devices as Registers. Furthermore, the nonvolatile microprocessor of FIG. 1 uses a magneto-electronic device as the nonvolatile "pass" switch 124 that is used to isolate elements from bus lines, or to connect an element to a bus line.

Figure 4:
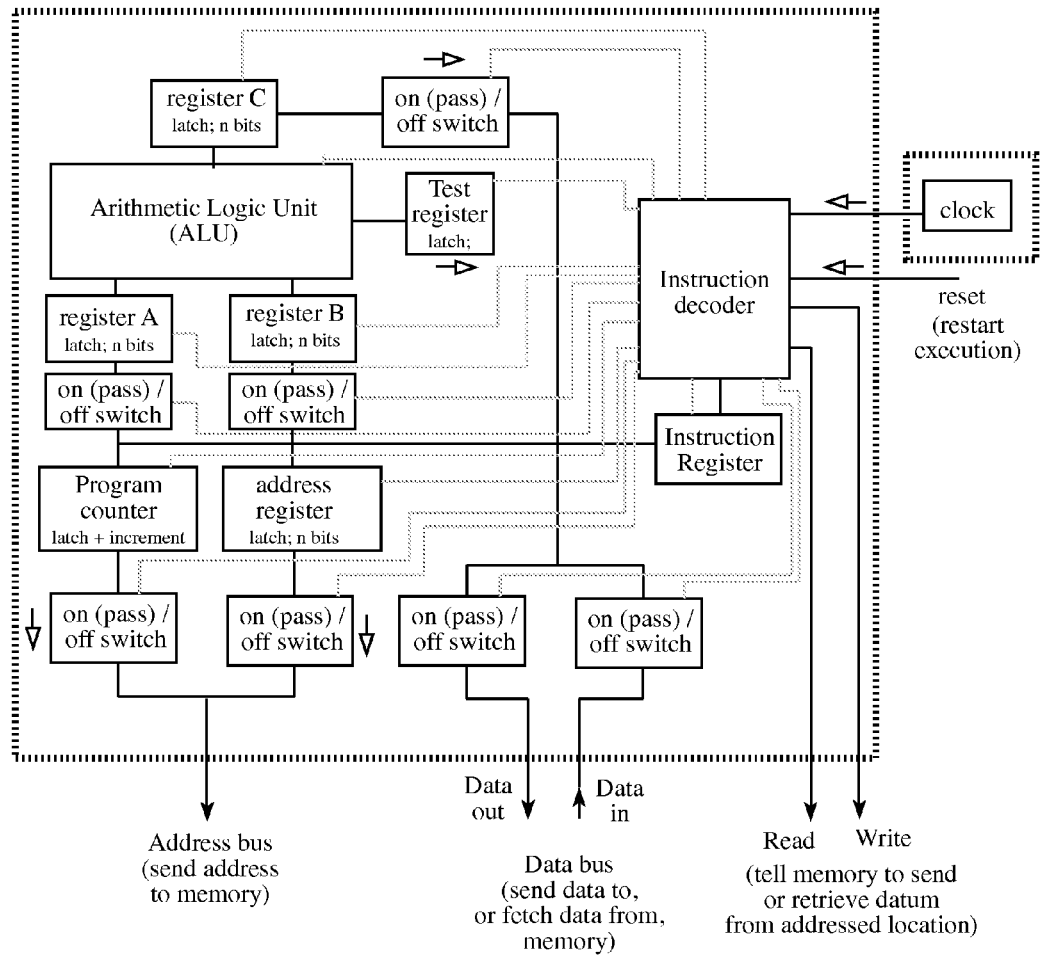
FIG. 4 is a schematic diagram of a typical prior art microprocessor is architecture.

It is not necessary to describe the Instruction Decoder 126 in FIG. 1 in detail, but a difference from that in FIG. 4 is that it includes a memory composed of a number of passive, nonvolatile magnetoelectronic storage cells. The instructions to be executed may be read into this memory as a separate process. The Instruction Decoder 126 also is presumed to have some nonvolatile buffer is memory that can be used to store and/or reuse values during program execution. Control lines (gray in FIG. 1) permit the Instruction Decoder 126 to control the elements in the circuit. It may be conceptually useful to note that a control line in FIG. 4 is typically used to supply a voltage to the gate of an FET, whereas a control line in FIG. 1 is typically used to supply a write current to the ferromagnetic element of a magnetoelectronic device.

The operation of the nonvolatile microprocessor system in FIG. 1 is very similar to that described with FIG. 4. For example, the LOADA mem# command operates in a similar fashion:

LOADA mem# Load register A 128 with the binary value in memory address "mem#"

The sequence of low-level instructions would be:
send "mem#" to address register 130
activate "NV pass switch" 132 to open line to Address bus 134
activate read line 136 (data in "mem#" is sent to Data bus) 138
activate "NV pass switch" 140 to open "Data In" line from Data bus 138
activate "NV pass switch" 124 to open line to Register A 128
data is sent to Register A 128 and stored in a nonvolatile way Using FIG. 1, two important features of the nonvolatile microprocessor can be described clearly. First, all of the circuit elements described by blocks are passive devices. Unlike the active circuit elements in the prior art of FIG. 4, the circuit elements in FIG. 1 draw zero quiescent power when there is no operation taking place in the system. These passive elements dissipate power only during an operational mode—that is, during the duration of individual pulses that set the device state or read out the device state. These pulses, and the power (or energy) associated with these pulses, are provided by a pulser (or clock) 142 that is preferably a separate entity and is not a part of the nonvolatile microprocessor. Because the quiescent power is zero, the nonvolatile microprocessor offers significant reduction of power consumption. It also follows that heating of the chip is minimized.

Second, ALU 100 in nonvolatile microprocessor of FIG. 1 is composed of a single reconfigurable gate that can be reconfigured dynamically. This is a new architecture and offers new techniques of programming. It also conserves space on the chip and the resulting microprocessor unit can be fabricated using smaller area.

As an example of dynamic reconfigurability, the circuit 100 of FIG. 1 was introduced as providing a single Boolean operation. The same circuit can perform the operation of a half adder using a simple sequence of operations:

1) Function "fn" 144 is set to be an OR operation (logic gate A?B 146 is set to OR). Input values A and B are sent to registers A 128 and B 148. The output of the OR operation is stored in the "result" register 122 of the reconfigurable gate and also is sent to the Test Register 150.

2) Function "fn" 144 is then set to be an AND operation (logic gate A?B 146 is set to AND). Inputs A and B are the same, and the output of the AND operation is stored in the "result" register 122.

3) The datum in Test Register 150 is now moved to Register B 148 and stored.

4) The datum in "result" register 122 is moved to Register A 128 and stored, and also is stored in the Test Register 150.

5) Function "fn" 144 is set to be NOT (logic gate A?B 146 is set to NOT). The NOT operation is performed on the datum in register A 128 and stored in "result" register 122.

6) The datum in "result" register 122 is moved to Register A 128 and stored.

7) Function "fn" 144 is set to AND (logic gate A?B 146 is set to AND), and the output is stored in the "result" register 122.

The half-adder processing function is now complete. The "total" bit is in "result" register 122 and the "carry" bit is in test register 150. The total and carry bits can be sent to the Instruction Register 152 and Instruction Decoder 126 for use in subsequent operations. These bits can be sent to other memory addresses (even if the other memory is nonvolatile memory on the same microprocessor chip). At the end of the process, no further power or pulses are supplied to the nonvolatile microprocessor. The results (the total and carry bits) are stored and can be used at a later time with no penalty of power dissipation.

This description has not included a discussion of the detailed operation of the Instruction Decoder 126 and Instruction Register 152. Developments in the characteristics and performance of magnetoelectronic devices are expected to be adequate to permit the fabrication of these elements—Instruction Decoder 126 and Instruction Register 152—using passive magnetoelectronic devices as well. The microprocessor can be also implemented using an Instruction Decoder and Instruction Register fabricated from conventional CMOS digital semiconductor devices and requiring steady state power. Such potential implementation of the processor would be denoted by adding further hashed lines surrounding these elements as shown in FIG. 1. Even in this alternative case, a substantial portion of the microprocessor is fabricated using passive devices that draw zero quiescent power and substantially lower power is required. Even in this case, the invention represents a significant improvement over the present art.

Thus a circuit architecture that achieves nonvolatile, reconfigurable logic is favorably compared to existing art digital electronic logic circuit architecture based on CMOS FETs. Other architectures using passive spintronic devices may be implemented in accordance with the present teachings, and would be expected to offer the same or similar advantages.

The aforementioned nonvolatile processor can be incorporated and used to produce very small and primitive nanoprocessor "chips." In this respect the processor can be incorporated what are sometimes referred to as "smart dust" applications, in which the device is expendable—i.e., it is deposited or left in an area to be monitored and then is left in place or discarded.

Figure 3A:
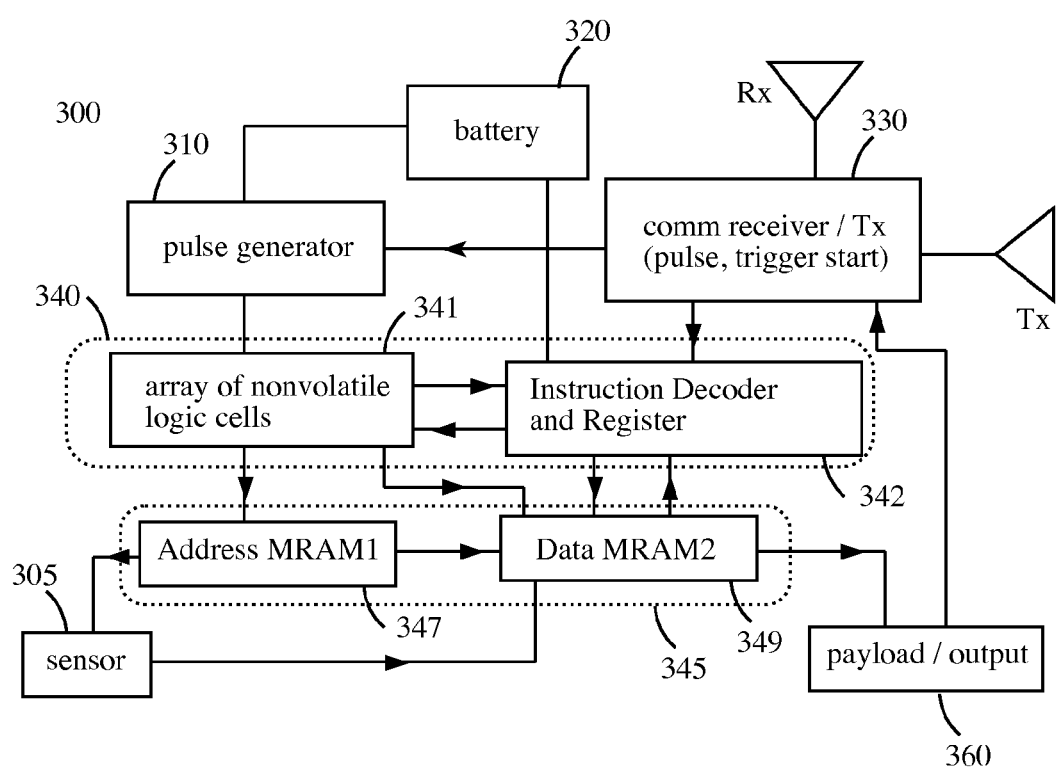
FIG. 3A is a schematic diagram of a preferred embodiment of a reconfigurable remote independent microsystem (RIM) implemented in accordance with the present teachings.

An example of the advantageous use of expendable circuits is an applications area that can be described as a remote independent microsystem (RIM) 300 shown in FIG. 3. A RIM is a platform with dimensions that preferably vary from the order of 1 micron to 10 cm. Preferably microsystem 300 includes one or more sensors 305, a pulse generator 310, a simple microprocessor 340 comprised of magnetoelectronic elements, a memory 345 also preferably constituted of magnetoelectronic storage elements, an energy supply 320 (typically a battery or capacitor), and a simple communications circuit 330 that includes means for receiving a data stream and/or instructions as well as means for transmitting data to a separate control unit (not shown). Current advances in nanobatteries demonstrate that extremely small scale power supplies (micron sized) can be effectuated in to be suitable with embodiments of the present application. Since the inventive circuits and systems do not require significant amounts of power at any moment in time, these types of batteries (including chemical variants) can provide sufficient energy for the present applications. Background information on such types of batteries can be found in an article titled "3D Printing of Interdigitated Li-Ion Microbattery Architectures" by Sun et al. Advanced Materials vol. 25, issue 33, pp. 45390-4543 (Sep. 6 2013) and in US Pub. No. 20130017453 by Ajayan, both of which are incorporated by reference herein. Other types of suitable battery types will be apparent to skilled artisans. It will be understood that other components and devices could be incorporated as well depending on a desired application's functions, performance requirements, etc.

The sensor 305 can be adapted to detect a particular chemical or biological agent, or a member of a class of such agents. Alternatively sensor 305 might be configured to detect natural or manmade signals, radioactivity or electromagnetic radiation within a chosen spectral range. Other types of stimuli (temperature, heat, pressure, energy) can be detected depending on the application, and the invention is not limited in this respect.

The microprocessor 340 preferably is an array of reconfigurable logic gates, as described above, or an applications specific logic array comprised of magnetoelectronic elements, and more preferably magnetic field controlled avalanche diodes of the type described above. The communications circuit 330 preferably includes a small integrated antenna for receiving and/or transmitting electromagnetic waves or pulses. These types of small antennas are now possible and are found for example in very small RFID ICs.

In applications, an appropriate configured population of RIMs 300 can be placed (using any conventional delivery mechanism) in field locations for monitoring/reporting on conditions in a target area. The sensor 305 can record data about the environment and the data (or a signal based on the data) can trigger an electronic response in the integrated circuit 300. Information about the state of the circuit 300 and sensor 305 may be transmitted to a control unit (not shown).

The prior art (see above) describes applications in which "smart dust" processors are designed to be mass manufactured using semiconductor processing technology. Large populations of such devices can be distributed at random over an area to monitor and report on a variety of conditions. The RIMs 300 of the present invention can operate in the same way, and the have the advantage of being smaller, cheaper, and more robust due to their hybrid nature. They can be deployed individually, in bulk, or attached to/integrated as part of some other physical substance/article to aid in transport or configuration in any particular application. For example when dispersed/dropped from an altitude it may be desirable to coat the RIMs with a liquid or a dissolvable agent of some kind as their small size may make them susceptible to drift or movement.

The prior art also describes biomedical applications, and the present RIMs 300 are also compatible with biological systems. A small population of RIMs 300 can be implanted in a living organism. RIMs that are designed and manufactured on a size scale of order 1 micron may be injected into a living organism and perform a function in a blood stream or inside living tissue. In this applications area, the prior art describes devices that have an additional ability to carry a payload such as a small amount of a therapeutic chemical, and again embodiments of the present RIM 300 can be adapted as such as well.

Most of the prior art smart particles/dust are microsystems with separate, multiple components. In some instances a "system on a chip," meaning a microsystem in which all components are fabricated on a single chip are being proposed. In all cases disclosed in prior art nonetheless, the microprocessor uses sequential synchronous logic, and the device includes some form of a clock and a power supply, which are drawbacks.

There is a need therefore for a remote independent system that uses minimal energy, such that it can be made extremely small, and inexpensively. The concept of nonvolatile logic as part of or combined with expendable circuits can be used with unique benefits and advantages in the broad RIM applications area.

Returning to the preferred embodiment shown in FIG. 3, a preferred RIM device 300 includes a pulse generator circuit 310 connected to a small power supply. By using a discrete data pulser (rather than a prior art clock) and replacing a prior art constant power supply with an intermittent power supply such as a small battery (or integrated nanobattery), the modified circuit also effectuates a logic block 340 in an expendable RIM. As shown in FIG. 3, RIM 300 also includes a memory block 345, including an array for an address bus (MRAM1) 347 and a larger memory array 349 for storing data (MRAM2). Both of these arrays are preferably nonvolatile magnetic random access memory arrays implemented using any conventional known ME element.

Furthermore, the expendable RIM 300 includes generally (A) one or more sensors 305, (B) a timer or receiver 330, and (C) a payload 360.

(A) The preferred sensors 305 are electronic, such as a resistor with a resistance value that reacts or changes in the presence of a target chemical or biological agent, or only in the event such agent has exceeded a particular threshold. As a second example, sensor 305 includes a magnetoresistor with a resistive value that changes in the presence of a magnetic field having a certain threshold. In this case, a chemical or biological agent (not shown) that binds to a magnetic nanoparticle (not shown) induces a change in resistance because of a proximal magnetic field from the magnetic nanoparticle. A read voltage applied to the resistor or magnetoresistor in sensor 305 would result in either a high or low current, and an output current could be stored as a high (1) or low (0) value of a magnetic memory cell in array 349. Other types of ME sensors (including electromechanical variants) and mechanisms for reading the same that are compatible with the present teachings will be apparent to those skilled in the art. It is expected that a wide variety of stimuli, conditions, events, etc. will be monitored using embodiments of the inventive RIMs.

(B) Timer/receiver logic 330 is used as a trigger to begin circuit operation. Circuit operation could be initiated automatically after a preset countdown, or in response to an outside trigger of some type. In the former case, a countdown timer could include a capacitor for example (not shown). When charge on the capacitor is depleted to a threshold value, an associated low voltage could trigger circuit 300 to begin operation. In real world applications with thousands of RIM devices 300 deployed in a target area, it will be possible of course to configure different sets of devices to trigger at different times in accordance with a desired target measurement observation of a particular parameter over time.

Alternatively, a simple trigger circuit 330 could take the form of another sensor that reacts or responds to an environmental or man made stimulus to cause a start operation. In other instances trigger circuit 330 can act and respond to an external signal through a conventional micron scale metal antenna that is capable of receiving a brief pulse transmitted at a chosen frequency tuned to the antenna. Reception of such external trigger pulse could trigger a current pulse in generator 310 that begins operation.

Other triggering circuits suitable for operation with the present invention will be apparent to those skilled in the art.

Payload 360 preferably is used to give an output of some form that indicates the results of circuit 340 operation. This output can then be detected by an external monitor or measuring device, or by directly interrogating device 300. For example, one type of payload could be in the form of two chemicals in separate micro- or nano-sized chambers that are separated by a membrane. In the event sensors 305 record a positive detection of a target agent/condition, a micro-electromechanical (MEMS) or nano-electromechanical (NEMS) actuator (not shown) is energized and penetrates the barrier membrane. The chemicals are preferably chosen in this implementation so that their combination forms a molecule that in turn responds to a chosen/target optical frequency. A population of RIMs 300 that showed positive response could then be detected by the is application of an external incident optical radiation and subsequent detection of reflected (or transmitted) light of the chosen wavelength.

As an alternative example, payload 360 could be a micron sized transmitting antenna capable of transmitting one (or several) pulses of a chosen, tuned electromagnetic wavelength. The payload 360 can also be connected in parallel with a fuse to ground (not shown). In the event that sensors 305 record a positive detection of a target (as confirmed by processing array 34), a current pulse is transmitted to the fuse. After the pulse destroys the fuse, one or more pulses are sent to the antenna to be transmitted, confirming the positive detection of the agent, condition or stimulus. Again any number of different types of outputs can be employed herewith in accordance with known techniques, and it is understood that the invention is not limited in this respect.

Figure 3B:
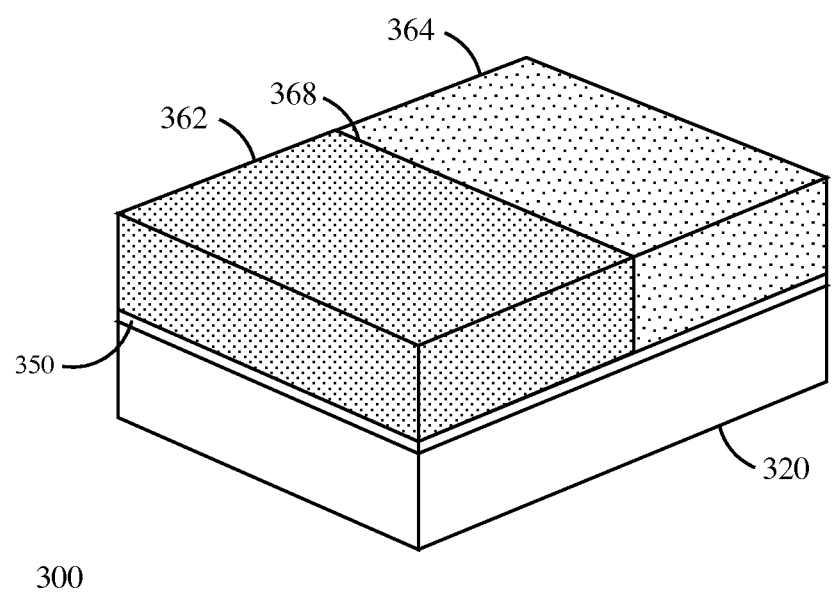
FIG. 3B illustrates a perspective sketch of an embodiment of a typical package for a RIM on a chip implemented in accordance with the present teachings.

FIG. 3B illustrates a perspective sketch of an embodiment of a typical package for an integrated system on a chip 300, which includes a number of components discussed above, including:

NVE logic and memory components for the RIM system situated on a common substrate 350;

battery 320;

part one of a payload 362 in this embodiment a chemical 1 part two of a payload 364 in this embodiment a chemical 2 a membrane 368 that separates chemicals 1 and 2; in this embodiment, a dye molecule results if the membrane is eliminated by an output of the system so that chemicals in the two payloads are permitted to mix.

An application for RIM system 300 may require that for any particular application the device perform a particular application function $F_A$, which requires a set of operations $O_A \{O1, O2 \ldots O_n\}$, for a certain number of times $T_A$. For example there may be P different payloads are that activated at P different times to respond to the same or different environmental variables. It will be understood that in turn the maximum number of tasks that can be achieved, or instantiations of such tasks, will be governed by a maximum battery capacity available to the system (subject of course to some tolerance) which defines a maximum number is of operations $O_{max}$ possible with any particular RIM system 300.

Similarly for any particular application there may be physical size constraints so that the maximum die or package size is subject to a particular device size limit. This in turn will constrain the number of NVE logic gates, NVE memory cells, etc. available for RIM 300 which can be made available for processing, storing program operational instructions, program data, etc. Consequently based on a required task functionality, and an allocated size budget, a maximum number of elements (i.e., N logic gates, M memory elements) is similarly identified. In some applications it may be desirable to use a single logic gate that is responsible for executing each instruction in response to a single pulse.

To operate the nanoprocessor, consider a target application function that is defined and which requires a nominal minimum sequence of S (e.g S=200) steps, starting with reading a program from memory, reading input from a sensor, and then performing an additional number (e.g. 50) boolean logic steps on this operational data. Each logic gate (again, which can be a single element), memory element, etc. is thus associated with one or more particular operations, to identify an overall nominal total device operational count. A table or compilation can be made therefore to identify a program sequence and associated device element for each operation in the associated function. The resulting task program sequence can be stored in the nonvolatile memory of RIM 300 for execution at the appropriate time. Other optimization techniques can be used to reduce a program size (and thus a memory gate count).

It will be appreciated that the selection, number and sequence of the operational steps can be optimized for any particular task based on operational requirements—for example so as to maximize battery life by reducing an amount of overall energy consumed for each instantiation or invocation of the device, thus allowing the device to have a longer lifetime in the field. Because the device can be reconfigured it is possible to spread out or serialize some operations, so that a function f can be divided into subfunctions f1, f2, which are performed at different times, thus reducing device count. In applications where timing or is speed is not critical, this utility can be exploited to spread out a task function over a longer period of time with the benefit of enhanced lifetime. In fact, as noted above, it is possible to multiplex the entire set of operations over time so that they can be performed individually by a single ME gate in response to a sequence of individual pulses in a highly integrated embodiment.

This aspect of the invention is made possible because for ME devices the main operational metric is energy, which is based on a number of operations required, not on time per se. That is, each step (a memory readout, a Boolean operation, storing a bit, etc.) requires a certain amount of energy: e.g. a readout energy, an STT write energy, or an energy for a Boolean operation (essentially the same as the write energy). By adding up the energy used by each device for the S steps (typically one device per step) one skilled in the art can derive the energy demand required of the battery (or other energy source) to sustain the nanoprocessor in any particular application.

Again unlike a conventional CMOS processor, the operations of a magnetoelectronic nanoprocessor 300 do not have to be synchronized, and/or they can be done in serial sequence to reduce a task operation and gate count. Each device requires a pulse (or two) to perform its operation and requires no energy at any other time. For ME devices, Spin Torque Transfer (STT) writing depends (to a good approximation) only on the total amount of current driven into the ferromagnetic element. In other words, a pulse duration is not important. One skilled in the art can further exploit this fact and implement a preferred power supply that provides relatively low current pulses over a relatively long duration. For the avalanche diode device noted above, an operating voltage can be as low as tens of mV. For a desired operation to be performed only once (or just a few times), timing is usually not crucial, and thus it does not matter if the entire sequence takes a few hundred nsec or a few hundred microsec or even longer. In some applications it may only be required that a particular result be rendered over the course of hours, or days. The RIMs of the present invention can be configured in ultra small (i.e., single gate) processing configurations to perform these kinds of field tasks. The only operational limit, as noted, is the is number of pulses that can be provided, which, in turn, determines the number of operations possible with any particular RIM.

For a CMOS implementation, by contrast, any operations must be synchronized. The amount of energy required is determined based on time—by considering how long the operation will take (how many clock cycles). Synchronized pulses must be provided to the devices for the required time. During that time, some of the devices draw idle power (the idle power of CMOS is low but not zero) and some draw active power. Nonetheless all devices must be powered.

It will be apparent to those skilled in the art that the above is not intended to be an exhaustive description of every embodiment which can be rendered in accordance with the present teachings. Other embodiments could be constructed which use a combination of features from the above described exemplary forms. Accordingly the present disclosure will be understood by skilled artisans to describe and enable a number of such variants as well.

What is claimed is:

1. A reconfigurable processing system situated on a single semiconductor chip, comprising:
   a magnetoelectronic processing circuit that includes one or more magnetic field controlled device(s) adapted to perform a first set of instructions during an operational mode on a first corresponding set of inputs;
   wherein each of set of instructions is implemented by a configuration operation, a readout operation, and a logic operation which varies according to a value associated with said configuration operation;
   the one or more magnetic field controlled device(s) being further adapted such that each performs a single logic operation and each single logic operation effectuated on said first corresponding set of inputs requires at most a single input pulse for each separate input;
   is each of said one or more magnetic field controlled device(s) being adapted to be powered by energy associated with one or more of said single input pulses.

2. The system of claim 1 wherein a single magnetoelectronic field control device is adapted to perform all operations implemented by the reconfigurable processing system.

3. The system of claim 2 wherein a single magnetoelectronic field control device performs N different logic functions at N different times using at most N different configuration pulses, N different readout pulses and 2N input pulses.

4. The system of claim 1 wherein said one or more magnetic field controlled device(s) each include a magnetic field controlled avalanche diode.

5. The system of claim 1 further including a sensor which is triggered based on an external stimulus and provides one of said first corresponding set of inputs to initiate operation of the magnetoelectronic processing circuit.

6. The system of claim 5 wherein the external stimulus is a chemical or biological agent.

7. The system of claim 5 wherein the external stimulus is electromagnetic radiation within a predetermined spectral range.

8. The system of claim 5 wherein the external stimulus is an external activation signal received by a microantenna on the chip.

9. The system of claim 1 wherein the magnetoelectronic processing circuit includes a non-volatile memory and is configured to record environmental data provided by a sensor situated on the single semiconductor chip.

10. The system of claim 1 wherein the magnetoelectronic processing circuit generates an output based on said first set of instructions, which output triggers a wireless communication to an external device.

11. The system of claim 1 wherein the magnetoelectronic processing circuit includes a fuse and a transmitting antenna configured such that an output based on said first set of instructions indicating a threshold is exceeded can set said fuse and trigger a communication by said transmitting antenna confirming said output to an external circuit.

12. The system of claim 11 wherein the magnetoelectronic processing circuit is configured to send one or more pulses to be transmitted, confirming the positive detection of an agent, condition or stimulus.

13. The system of claim 11 wherein the magnetoelectronic processing circuit is is configured to operate without a clock.

14. The system of claim 1 wherein the magnetoelectronic processing circuit includes a first payload comprising two different (first and second) chemicals separated by a first membrane, and is configured to generate a first output based on said first set of instructions, which first output causes said first membrane to be destroyed and said two different chemicals to mix and form a first molecule which is optically detectable in a first target frequency.

15. The system of claim 14 wherein said molecule includes a dye.

16. The system of claim 1 wherein each magnetic field controlled device includes a configuration input terminal for reconfiguring an operation performed by such device.

17. The system of claim 1 the magnetoelectronic processing circuit includes P separate payloads activated at P different respective time in response to sensor detected environmental variables.

18. The system of claim 14 wherein the magnetoelectronic processing circuit includes a second payload comprising two different (third and fourth) chemicals separated by a second membrane, and is configured to generate a second output based on a second set of instructions, which second output causes said second membrane to be destroyed and said two different chemicals to mix and form a second molecule which is optically detectable in a second target frequency.

19. The system of claim 1 wherein the magnetoelectronic processing circuit includes a first payload comprising a therapeutic chemical that is released based on a result of said first set of instructions.

20. A reconfigurable processing system situated on a single semiconductor chip, comprising:
  a magnetoelectronic processing circuit that includes a single magnetic field controlled gate adapted to perform a first sequence of operations during an operational mode on a first corresponding set of inputs provided by one or more sensors, said first set of operations including at least two different Boolean operations;
  wherein the magnetoelectronic processing circuit is configured such that each of said sequence of operations is effectuated with a single pulse and is carried out at a separate time by said single magnetic field controlled gate based on a sensor input;
  further wherein said single magnetic field controlled gate is adapted to be powered by energy associated with said single pulse and does not consume is power in a quiescent state;
  a non-volatile memory coupled to said single magnetic field controlled gate for storing a plurality of output results associated with said first sequence of operations;
  one or more payloads coupled to said magnetoelectronic processing circuit responsive to said plurality of output results.

21. The system of claim 20 further including a table stored in said non-volatile memory identifying said first sequence of operations and an order therefor.

22. A reconfigurable processing system situated on a single semiconductor chip, comprising:
  a magnetoelectronic processing circuit that includes one or more magnetic field controlled device(s) adapted to perform a first set of instructions during an operational mode on a first corresponding set of inputs;
  wherein each of set of instructions is implemented by a configuration operation, a readout operation, and a logic operation which varies according to a value associated with said configuration operation;
  a timing circuit configured to trigger said operational mode, and generate a set of control pulses for effectuating logic operations on said first corresponding set of inputs;
  each of said one or more magnetic field controlled device(s) being adapted to be powered by energy associated with one or more of said single input pulses and operated without a clock.

23. The system of claim 22 wherein at most five (5) single pulses are required to effectuate a Boolean function on two separate inputs.

* * * * *